United States Patent [19]

Hayes et al.

[11] Patent Number: 5,485,353
[45] Date of Patent: Jan. 16, 1996

[54] RETAINER ASSEMBLY

[75] Inventors: William P. Hayes, Santa Ana; John P. Dreher, Mura Loma, both of Calif.

[73] Assignee: Eg&G Birtcher, Inc., El Monte, Calif.

[21] Appl. No.: 276,542

[22] Filed: Jul. 18, 1994

Related U.S. Application Data

[63] Continuation of Ser. No. 23,613, Feb. 26, 1993, abandoned.

[51] Int. Cl.$^6$ ............................ H05K 7/14; H05K 7/20
[52] U.S. Cl. .................. 361/802; 165/80.3; 165/185; 361/704; 361/726; 403/24
[58] Field of Search ................... 165/80.3, 185; 174/16.3; 361/690, 703, 704, 726, 740, 756, 759, 796, 801, 802; 439/327, 328; 403/24, 374, 409.1

[56] References Cited

U.S. PATENT DOCUMENTS

| | | | |
|---|---|---|---|
| 4,131,933 | 12/1978 | Agard et al. | 361/415 |
| 4,298,904 | 11/1982 | Koenig | 361/386 |
| 4,318,157 | 3/1982 | Rank et al. | 361/386 |
| 4,415,212 | 11/1983 | DePillo | 339/17 C |
| 4,502,601 | 3/1985 | Husted et al. | 361/415 |
| 4,701,984 | 10/1987 | Wyckoff | 24/573 |
| 4,707,764 | 11/1987 | Cogan | 361/390 |
| 4,721,155 | 1/1988 | McNulty | 164/80.2 |
| 4,751,963 | 6/1988 | Bui et al. | 165/80.2 |
| 4,823,951 | 4/1989 | Colomina | 206/328 |
| 4,826,447 | 5/1989 | Forker et al. | 439/328 |
| 4,869,680 | 9/1989 | Yamamoto et al. | 439/327 |
| 4,914,552 | 4/1990 | Kecmer | 361/415 |
| 4,953,059 | 8/1990 | McNulty | 361/386 |
| 4,976,358 | 12/1990 | Stickel et al. | 211/41 |
| 4,979,073 | 12/1990 | Husted | 361/386 |
| 5,036,428 | 7/1991 | Brownhill et al. | 361/386 |

OTHER PUBLICATIONS

EG&G Birtcher, El Monte, Calif. 1992 Catelog.

*Primary Examiner*—Gregory D. Thompson
*Attorney, Agent, or Firm*—Wolf, Greenfield & Sacks

[57] ABSTRACT

An assembly is provided for uniformly applying pressure to a selected portion of a circuit board mounted between spaced surfaces. The assembly includes a retainer for selectively applying pressure to a proximal surface of the circuit board and a stiff U-shaped bar having a channel in which the retainer is mounted, the bar thus being interposed between the retainer and the circuit board. Preferably, the retainer includes at least one member that is attached to the bar by a snap-in fit. When the retainer is actuated, the bar is pressed against the circuit board, thereby causing the opposite surface of the circuit board to uniformly press against a housing slot wall. A side wall of the bar preferably contacts a wall of a slot in which the assembly is mounted to enhance heat transfer. The retainer preferably has members of minimal size contacting the bar to enhance uniformity of pressure and preferably has an internal channel in intermediate retainer members, which channels are only large enough for an actuator rod to pass therethrough.

17 Claims, 4 Drawing Sheets

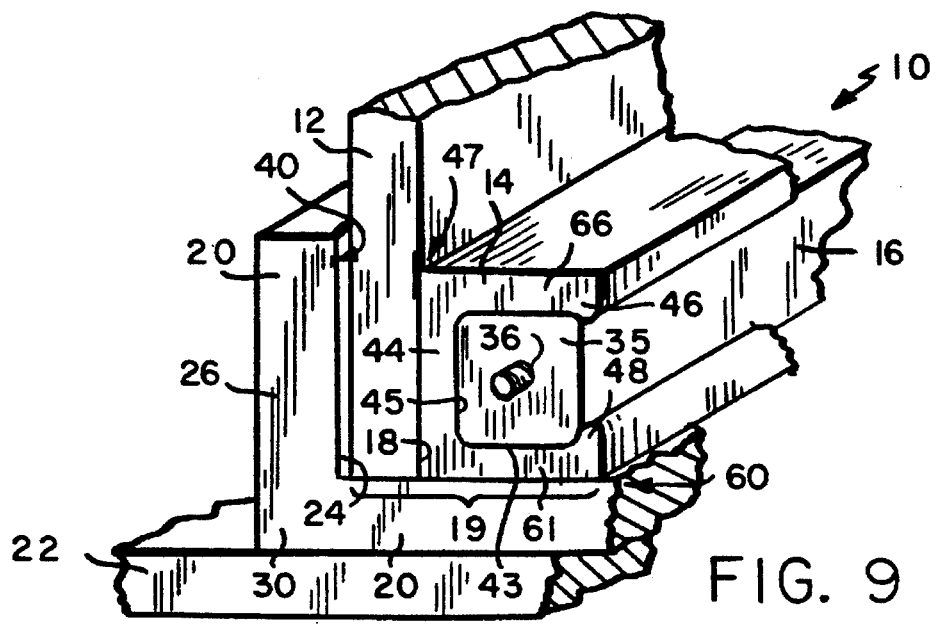
FIG. 9
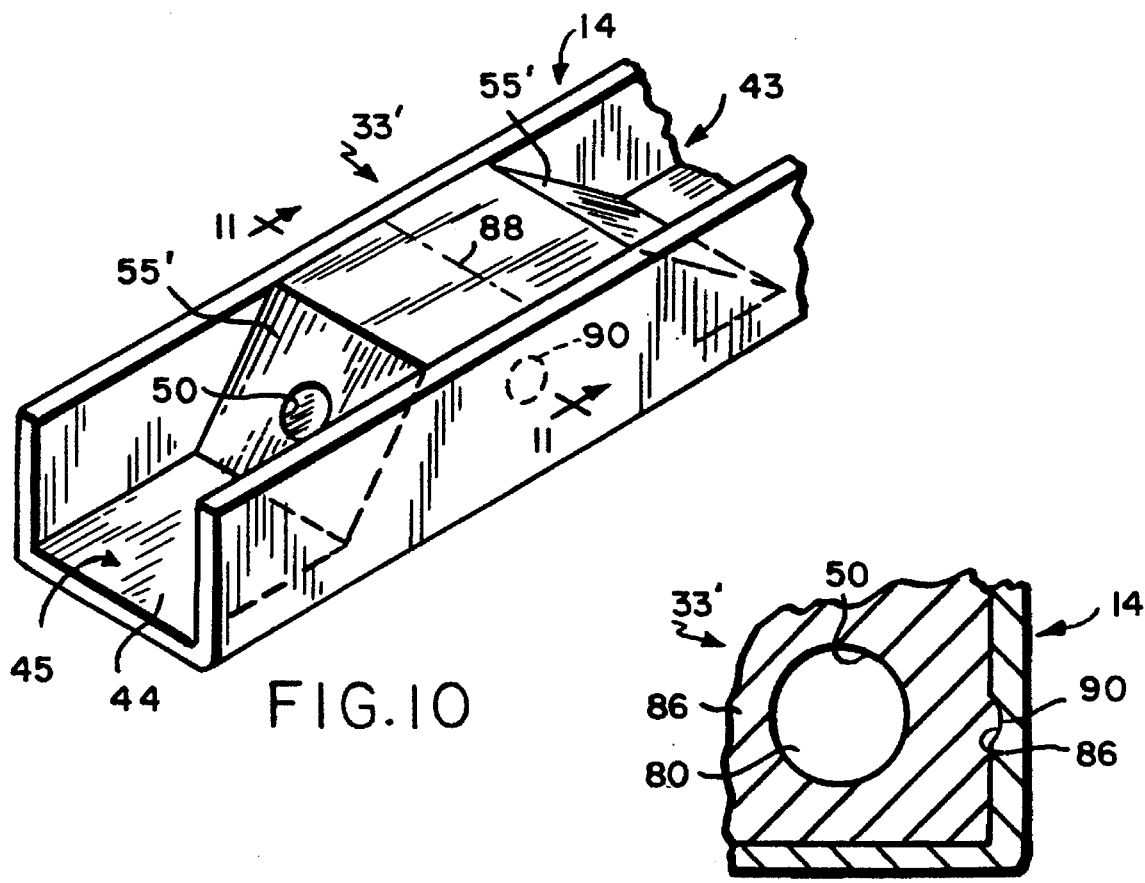
FIG. 10
FIG. 11

RETAINER ASSEMBLY

This application is a continuation of application Ser. No. 08/023,613 filed Feb. 26, 1993, now abandoned.

FIELD OF THE INVENTION

The present invention relates to retainer assemblies for clamping a printed circuit board between spaced surfaces within a chassis or housing and more particularly to a retainer assembly for more uniformly applying pressure to a selected portion of a circuit board which is mounted in a housing slot.

BACKGROUND OF THE INVENTION

Electronic equipment often employs printed circuit boards or cards. These cards typically are mounted in a chassis or housing by stacking the cards in row alignment with one another. Row alignment in the chassis is defined by slotted or spaced surfaces within or on the chassis, with each board placed in a slot or between a pair of spaced surfaces. A retainer may be provided in the chassis slot to captivate a card positioned therein. Many applications for such retainers require high performance that will captivate a printed circuit board under the most extreme shock and vibration conditions such as those encountered by spacecraft or military aircraft.

Typical printed circuit board retainers are described in U.S. Pat. Nos. 4,823,951 and 5,036,428, the teachings of which are incorporated herein by reference. Such retainers comprise a partially threaded screw or rod and a plurality of members slidably mounted in an end-to-end relationship on the rod. The members disposed on the rod have wedge-shaped end portions which are engagable with one another. The wedge-shaped end portions serve to move at least one of the members in a transverse direction relative to the rod when the members are moved towards one another along the rod. Such movement may be achieved by providing the rod with screw threads to engage and move the distal-most member when the rod is rotated. Alternatively, the movement may result from the action of a lever assembly used to draw the rod away from the distal-most member, thereby pulling that member toward its companions.

Commonly, the rod in prior art retainers is threaded at one end to engage with mating threads on a nut attached to the endmost sliding members mounted on the rod. The opposite end of the rod includes a portion that may be engaged by a tool to allow the rod to be rotated. In so doing, the members are moved toward one another as the threaded rod is rotated in the tightening direction.

The transverse direction in which the member is moved acts to engage a clamping surface of that member against an edge of the printed circuit board. The opposite edge of the board is thereby forced into contact with, and clamped against, a spaced surface fixedly connected to or integral with the chassis in which the board is to be mounted. Typically, the spaced surface is the wall of a housing that is screwed or riveted to the chassis.

In many high performance applications, the circuit board chassis comprises a sealed box which does not allow cooling air to pass over the circuit board. Rather, heat generated by the circuit board is conducted through a metal heat sink attached to the printed circuit board and then transmitted to a heat exchanger or plenum. The heat transfer path is that between the printed circuit board and the slot surface of the chassis or housing against which the board is clamped. The heat generated by the electrical components must be removed from the circuit board in order to maximize equipment performance and to minimize downtime. Accordingly, the housings in which the circuit boards are mounted are normally fabricated of a material having good heat conduction properties so as to also serve as a heat sink for dissipating the heat generated by the circuit board components.

Various attempts have been made in the prior art to facilitate the removal of heat from the circuit board to the housing. Typically, these efforts have included employing housing materials having improved heat conduction properties, increasing the contact area between the circuit board and the adjacent housing wall and employing pressure to eliminate void spaces at the interface formed between the circuit board and the housing wall, thereby improving the quality of the contact therebetween. Since at the microscopic level, solid surfaces are not absolutely flat, the contact interface between two solid surfaces consists of many small points of contact. These points of contact are affected by the surface smoothness, malleability and the degree of pressure forcing together the contacting surfaces. As the contact pressure between two solid surfaces is increased, the actual contact area is increased and thermal resistance between the surfaces is reduced. Conversely, at low contact pressures, much of the heat transfer is through void spaces located between the points of contact and thermal resistance at the interface of the surfaces remains high.

It is therefore highly desirable to maximize the cross-sectional contact area between the circuit board and the housing in order to create the least possible resistance to heat flow. One difficulty with prior art circuit board retainers is that heat conduction through the side of the circuit board contacting the retainer is limited because the surface area of the cams or sliding members which contact the circuit board is generally small. Thus, the efficiency of heat removal from the board for the prior art retainers is dependent upon heat conduction across the primary interface formed between one surface of the circuit board and the abutting housing wall.

In addition, the pressure exerted against the circuit board for a retainer having a discontinuous surface contacting the circuit board, for example, the above-referenced wedge-type retainer, is uneven. The uneven distribution of pressure across a portion of the circuit board increases the likelihood of breaking the circuit board as the retainer pressure is increased. Another problem with retainers having a discontinuous surface, is that heat conduction from the board through the retainer occurs independently at each discontinuous surface. As a result, some of the surfaces may receive a larger amount of heat from the board, depending upon whether a larger amount of heat is generated by circuit board components in the vicinity of one retainer surface compared to another retainer surface. Stated another way, the retainer is incapable of evenly distributing the heat removed from the circuit board. Retainers having a continuous surface contacting the circuit board can more efficiently remove heat from the board because the continuous surface can act as an isothermal plane to redistribute the heat removed from the board across the length of the continuous surface.

The prior art has recognized the problems of increased thermal resistance associated with the application of non-uniform pressure across the length of the circuit board. To solve this problem, several prior art retainers have provided a continuous surface area for pressing an edge of the circuit board against an adjacent housing wall. These retainers attempt to facilitate the removal of heat from the board by forcing a first surface of the circuit board against the adjacent housing wall, thereby increasing the actual contact area between the abutting surfaces.

For example, U.S. Pat. No. 4,721,155, issued to McNulty, discloses a circuit board retainer for pressing an edge of a circuit board heat sink, i.e., the heat conductive plate upon which the circuit board is mounted, against a housing slot wall. The circuit board retainer includes a mating pair of sawtoothed bars having slidingly engaging teeth. One of the bars is attached to the housing wall. The other bar is free to engage an edge of the circuit board. As the bars are forced apart, the second bar engages the edge of the circuit board heat sink, forcing the opposite side of the board against its adjacent housing wall.

U.S. Pat. No. 4,869,680, issued to Yamamoto et al., discloses a rod assembly for retaining a circuit board, the assembly including a generally cylindrical rod having a plurality of holes aligned along a first side of the rod. The holes are oriented substantially perpendicular to the longitudinal axis of the rod, each hole including a ball which is projected outwardly, i.e., beyond the first side of the rod, by a first biasing means. Rotation of the rod causes the plurality of balls to bear against one side wall of the housing slot. This, in turn, forces the opposite surface of the circuit board against the opposing wall of the slot.

The above-described retainers attempted to reduce thermal resistance at the primary interface by providing a retainer having a continuous surface cammed against one side of the circuit board to force the other side of the circuit board against its adjacent housing wall. Although the prior art recognized the advantage of distributing pressure along the length of the circuit board, the above-described constructions are not entirely satisfactory. In particular, these retainers do not provide optimum resistance to bending and/or twisting of the bar in contact with the circuit board under pressure and therefore may not uniformly distribute pressure over a portion of the circuit board.

In addition, the efficiency of the above-described retainers in removing heat from the circuit board is dependent on only two heat conduction paths to remove heat from the board to the housing, only one of which paths is free of air gaps. In a first heat conduction path, heat is removed from the board across a primary interface formed at the junction of one side of the circuit board and a housing wall. In a second heat conduction path, heat is removed from the board across a secondary interface formed at the junction of the opposite side of the board and the retainer. In both patents, there are air gaps in the heat flow path through the retainer. Finally, neither of the above-described retainers discloses a third heat conduction path including a third interface across which heat is removed from the circuit board to the housing.

A need, therefore, exists for a retainer assembly capable of uniformly pressing a portion of a circuit board against an adjacent housing wall. Preferably, the assembly should be designed and constructed to provide enhanced heat conduction paths for facilitating heat removal from the board. An improved assembly should also permit insertion of the assembly into an existing housing without substantial modification of the housing and/or retainer. This latter objective requires that, if the retainer is to have a bar for transferring pressure to the circuit board or other panel, the bar be designed to provide optimum resistance to bending and twisting for the space available.

SUMMARY OF THE INVENTION

In accordance with the purposes of the invention as embodied and described herein, the present invention provides an assembly for applying pressure, preferably uniformly, to a selected portion of a circuit board or other panel which is mounted in a housing slot. The uniform distribution of pressure across a portion of the circuit board improves the removal of heat from the circuit board, reduces the likelihood of breaking the circuit board as the retainer pressure is increased, thus permitting higher pressures to be employed, and provides a mechanically stronger grip to retain the circuit board in position. The assembly is relatively inexpensive to fabricate and assemble and can be readily removed from the housing slot for inspection, repair and/or replacement. In contrast to the circuit board retainers of the prior art, the instant invention can be used in combination with existing housing slots, i.e., to "retrofit" existing housings.

The assembly includes a U-shaped bar having a base wall with side walls extending from opposite ends thereof. The base wall and side walls define a channel in which a pressure applying retainer is mounted with an orientation so as to apply pressure to the base wall. The assembly is mounted in the housing slot with the base wall against the selected portion of the panel. In a circuit board application, the panel may be the circuit board or may be a circuit board or circuit card assembly which includes a heat sink to which the board or card is mounted. The card may cover all or only a portion of the heat sink. For preferred embodiments, the bar is mounted to circuit board or to the heat sink and provides an additional heat conduction path for removing heat from the board.

Actuating the pressure applying assembly forces one surface of the retainer to press against the base, and an opposite surface of the retainer to press against its abutting housing slot wall. By maximizing the contact areas between the circuit board and the housing wall, and between the retainer and its abutting housing wall, the instant invention reduces thermal resistance at the interfaces formed at these junctions, thereby improving heat removal from the board to the housing. One side wall of the bar may also be in contact with a wall of the housing slot to provide an additional heat transfer path from the board or panel and heat transfer through this path may be enhanced by causing the pressure applying assembly to also apply pressure to this side wall when actuated.

It will be appreciated that various circuit board retainer designs may be used in combination with the instant invention. In a preferred embodiment, a multi-wedge type circuit board retainer is utilized for the pressure applying assembly. In a most preferred embodiment, at least one member (for example, an intermediate member or "center wedge" for a five-member retainer or end three members for a member retainer) is attached to the U-shaped bar by a "snap-fit" or other suitable means, thereby eliminating the need for bonding, riveting, screwing, or other means of attachment to join the retainer to the bar. The circuit board retainer may include five members (wedges), with the end members and the intermediate member consuming a relatively small proportion of the length of the retainer and the members adjacent the intermediate member consuming a relatively large proportion of the length of the retainer. In particular, the length of the intermediate member is preferably as small as possible while still assuring that there is no contact between the adjacent members when the retainer is fully operated to apply pressure to the panel. This generally requires that the length of the long side of the intermediate wedge elements be roughly three to four times the length of the base leg of a solid right-angled triangle having the angled wedge surface as its hypotenuse. Actuating the retainer forces the two longer members to press against an abutting housing wall and the three short members make essentially point contact near the center and ends of the base wall of the bar. Since the bar is very Stiff, this assures more uniform application of pressure to the panel through the bar than if pressure were applied over a larger area. For a three-member retainer, a similar result is achieved by use of a large center member and small end members, the length of which may be half that specified above for the intermediate member.

The members are configured with an internal longitudinal channel for receiving a rod. In a preferred embodiment, the internal longitudinal channel of the intermediate member has a transverse dimension that is only slightly larger than the outside dimension of the rod. The increased mass of the intermediate member facilitates heat conduction through the retainer and also reduces thermal resistance at the interfaces of the intermediate member and its adjacent members by providing a larger contact area at these interfaces.

Additional features and advantages of the invention will be set forth in the description which follows, making reference to the accompanying figures.

BRIEF DESCRIPTION OF THE DRAWINGS

FIG. 9 is a side perspective view of a modified retainer assembly of FIG. 1;

FIG. 10 is a perspective view of an intermediate member of the modified five-wedge retainer of FIGS. 5 and 8; and FIG. 11 is a cross-sectional view of the intermediate member taken along the line 11—11 of FIG. 10.

DETAILED DESCRIPTION OF THE INVENTION

Reference will now be made in detail to the present preferred embodiments of the invention as illustrated in the accompanying drawings.

Figure 1:
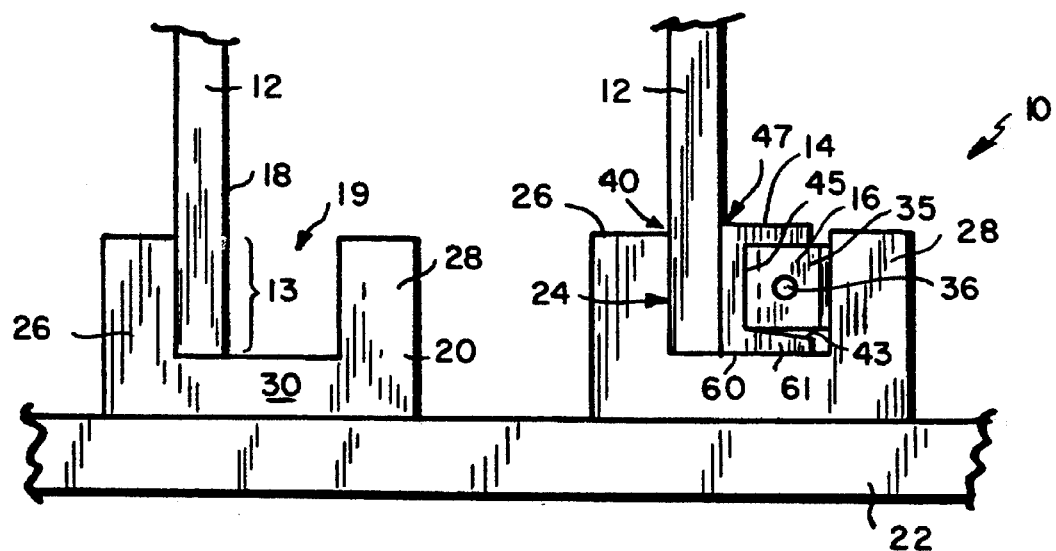
FIG. 1 is an end view of a first embodiment of the retainer assembly of the invention, inserted into a detachable base portion of a housing.

Various embodiments of an assembly 10 for uniformly applying pressure to a selected portion 13 of a circuit board or circuit board assembly 12 (hereinafter referred to as "circuit board") are illustrated in FIGS. 1–10. Assembly 10 comprises a bar 14 and a circuit board retainer 16 for selectively applying pressure to a proximal side 18 of the circuit board. The assembly 10 and circuit board 12 are positioned in an elongated slot 19 formed in base portion 20 of a housing 22 and are arranged so that bar 14 is interposed between the retainer and circuit board. For preferred embodiments, bar 14 is attached to circuit board 12 (or to a heat sink portion of a circuit board assembly) by screwing, riveting, soldering, bonding or other suitable means (see, for example, rivets 73 in FIG. 3). Each slot 19 is defined by a distal wall 26, a proximal wall 28 and a bottom wall 30. Although a detachable base portion is shown in FIG. 1, the base portion may alternatively be formed as an integral part of the housing. While in FIG. 1 an assembly 10 is shown in only one of the housing slots to permit more clear illustration of circuit board portion 13 and the walls which form slot 19, an assembly 10 would typically be utilized in all active slots.

Although FIG. 1 illustrates an assembly for uniformly pressing against a circuit board portion, the instant invention is useful for uniformly applying pressure against any flat panel and is not limited in scope to circuit board applications. Accordingly, assembly 10 can be used, for example, to uniformly press a panel against an abutting surface during a machining process. The uniform application of pressure reduces the likelihood of breaking the panel as the retainer pressure is increased and provides a mechanically stronger grip to retain the panel in position during the machining process.

Housing 22 (including base portion 20 thereof) serves as a heat sink for dissipating heat generated by electrical components and wiring (neither of which are shown) on circuit board 12. As will be described below, assembly 10 facilitates the removal of heat from the board by utilizing retainer 16 to press against bar 14 which, in turn, uniformly applies pressure to circuit board portion 13. The uniform application of pressure reduces thermal resistance at a primary interface 40 formed between distal surface 24 of the circuit board and housing wall 26. As described below, heat is removed from the board to the housing by way of three principal heat conduction pathways, each of which includes the removal of heat across at least one interface.

Figure 2:
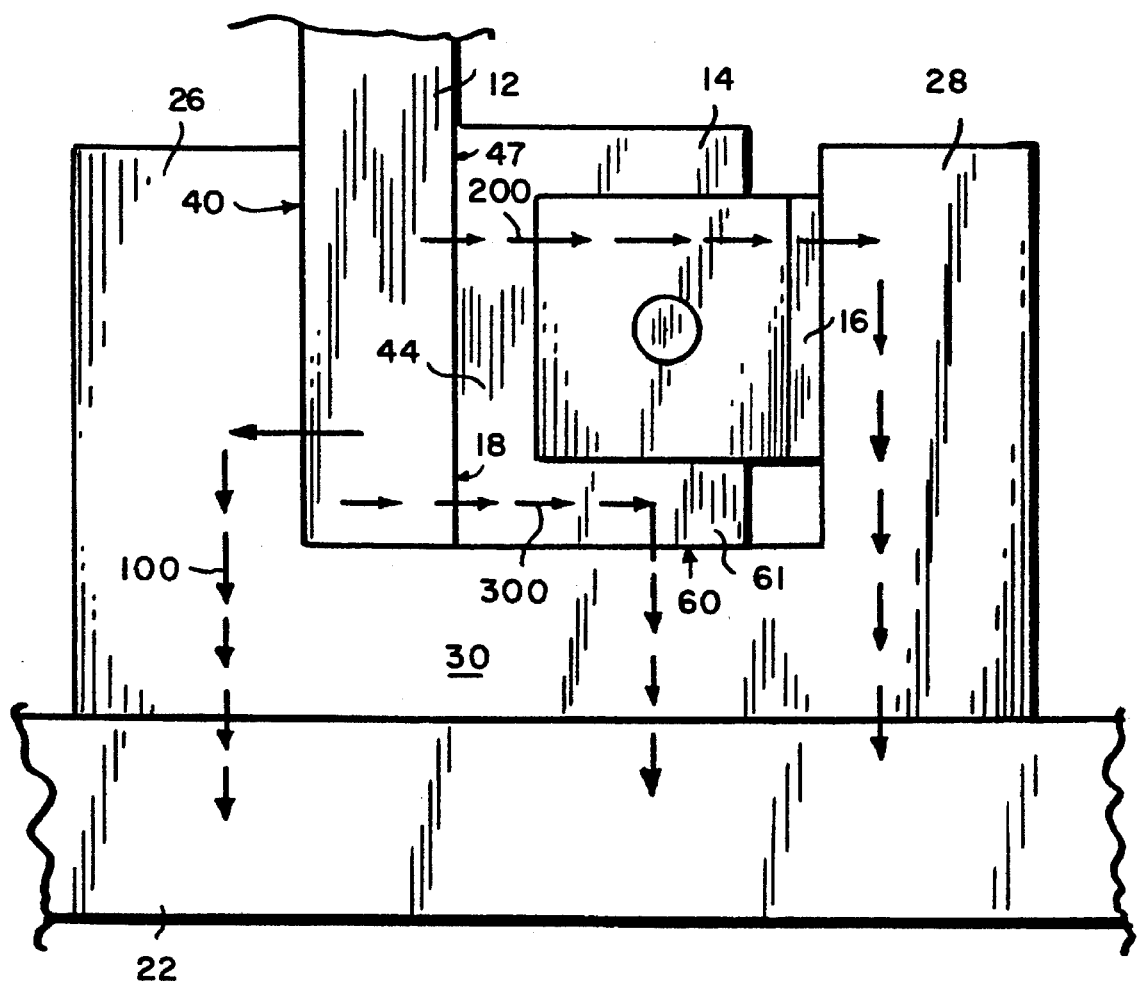
FIG. 2 illustrates the heat conductive pathways for the retainer assembly of FIG. 1.

The heat conduction pathways are schematically illustrated for a U-shaped bar in FIG. 2. Only those elements that are essential to an understanding of heat flow are shown in the figure to more clearly illustrate the pathways involved in the removal of heat from the circuit board to the housing. In a first heat conduction path 100, heat is removed from board 12 across primary interface 40 and into housing wall 26. In a second heat conduction path 200, heat is removed from board 12 across a secondary interface 47 formed at the junction of circuit board proximal surface 18 and bar base wall 44, through retainer 16 and into housing wall 28. In a third heat conduction path 300, heat is removed from board 12 across secondary interface 47, through bar side wall 61, across third interface 60 (formed at the junction of bar wall 61 and bottom wall 30 of the housing) and into housing wall 30. The second and third heat conduction paths are in fact shown schematically and, in fact, both paths are available for removing heat from board 12 which enters bar 14 across interface 47 and is dispersed through the bar.

Placement of bar 14 between the retainer and the circuit board reduces thermal resistance at primary interface 40 by uniformly pressing the circuit board against housing wall 26, thereby reducing or eliminating void spaces normally existing between these surfaces and increasing the points of contact therebetween. The bar also acts as an isothermal plane to more equivalently distribute heat that has been removed from the circuit board to the bar through secondary interface 47. Heat conduction through secondary heat conduction path 200 is less efficient than conduction through the first heat conduction path because the surfaces of the retainer pressing against the bar 14 and housing wall 28 are discontinuous with substantial open spaces, therefore resulting in smaller contact areas than the area of contact formed at the junction of the board and its adjacent housing wall 26. The wedge junctions are also part of this heat conduction path. Because of the large openings normally present in such surfaces for the rods, these junctions provide small contact areas (i.e. have small thermal mass), reducing thermal conduction through the path.

In the third heat conduction path, heat from the board enters bar 14 (as described above), then enters the housing after crossing interface 60. Heat transfer through the third heat conduction pathway may be less efficient than heat transfer through the first and second pathways because the pressure of bar 14 against the housing at third interface 60 is normally incidental and is not subject to the transverse forces involved at the primary and secondary interfaces. However, heat transfer through this path may be enhanced by modifying retainer 16 and/or bar 14 so that the retainer, when operated, applies pressure both to base wall 44 and side wall 61 of the bar. This may be accomplished in a number of ways including having the wedge surfaces of the retainer member angled at a bias in two planes to apply forces in the two desired directions. A similar result could be obtained with a ramp-shaped inner surface for wall 61.

As will be apparent to one of ordinary skill in the art, heat conduction may occur through pathways which vary slightly from those described above while still remaining within the spirit of the invention. As will also be apparent to one of skill in the art, the extent of heat removal from the board depend, at least in part, upon the dimensions of the bar.

Figure 3:
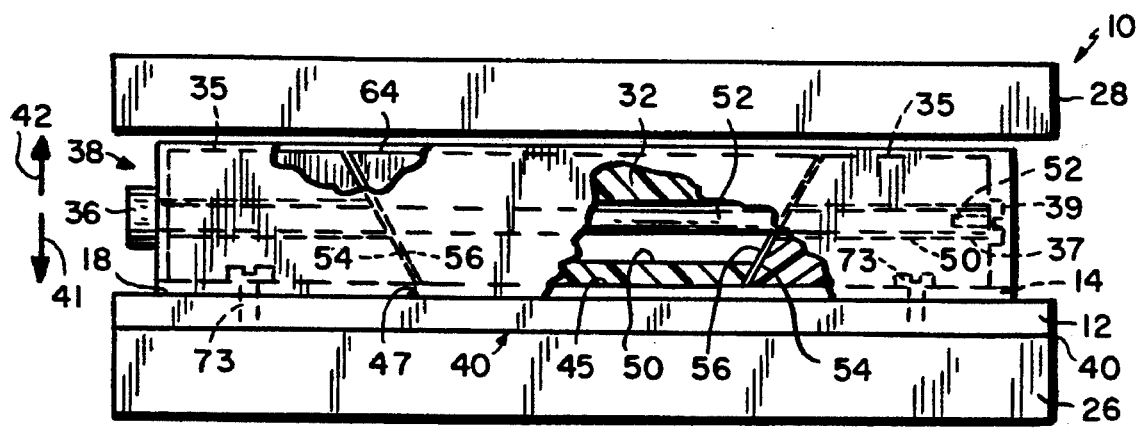
FIG. 3 is a top view of the retainer assembly of FIG. 1, shown in an unlocked (relaxed) state and including a three-wedge retainer.
Figure 4:
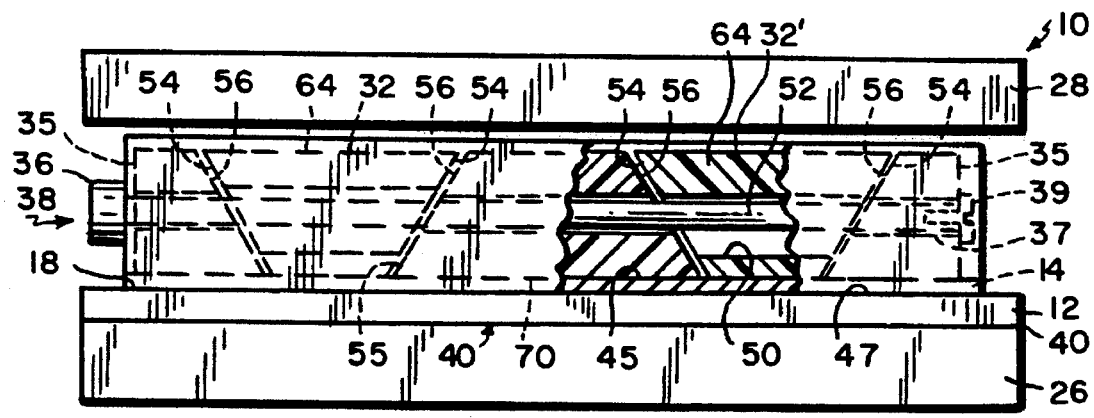
FIG. 4 is a top view of the retainer assembly of FIG. 1, shown in an unlocked (relaxed) state and including a five-wedge retainer.
Figure 5:
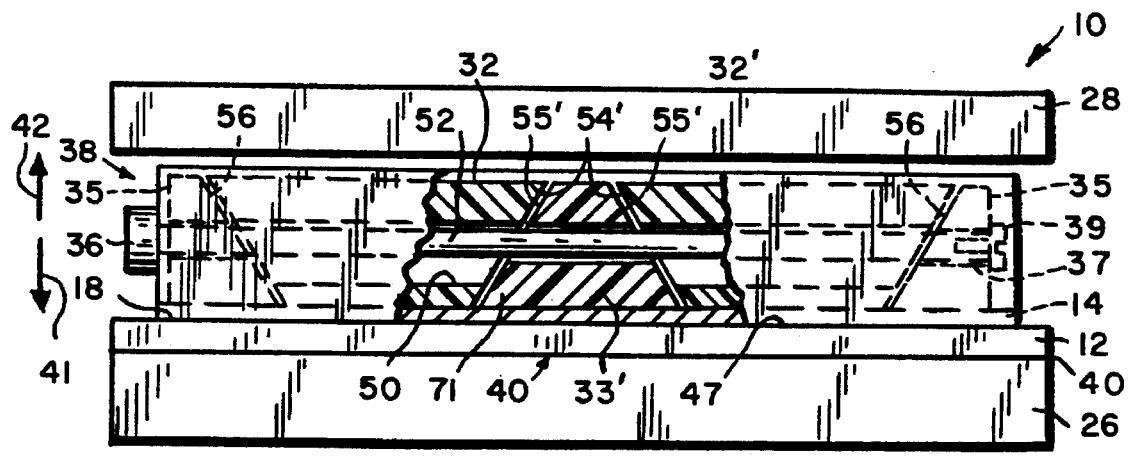
FIG. 5 is a top view of the retainer assembly of FIG. 1, shown in an unlocked (relaxed) state and including a modified five-wedge retainer.
Figure 6:
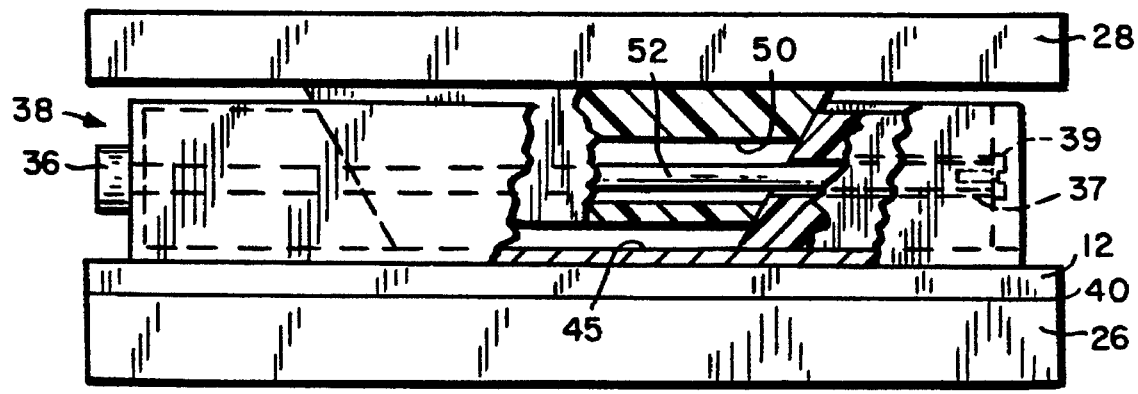
FIG. 6 is a top view of the retainer assembly of FIG. 1, shown in a locked (compressed) state and including a three-wedge retainer.

Top views of circuit board assembly 10, including a U-shaped bar and a multi-wedge retainer 38, are illustrated in FIGS. 3–5 (unlocked configuration) and 6–8 (locked configuration). Retainer 38, which is suitable for use as circuit board retainer 16, includes at least one pressure member 32 and two end members 35. As will be appreciated by one of ordinary skill in the art, retainer 38 may include a plurality of pressure members 32 having an intermediate member 33 positioned between each adjacent pair of pressure members. Accordingly, FIGS. 3 and 6 illustrate three member wedge-type retainers (i.e., one pressure element and two end members) and FIGS. 4, 5, 7 and 8 illustrate a five member wedge-type retainer (i.e., two pressure elements, one intermediate member and two end members). The embodiment of FIGS. 4 and 7 differs from the embodiment of FIGS. 5 and 8 in the relative dimensions of the pressure members and the structure of the intermediate member. In particular, the length of the intermediate member is preferably as small as possible while still assuring that there is no contact between the adjacent members when the retainer is fully operated to apply pressure to the panel. This generally requires that the length of the long side 70 of the intermediate wedge elements be roughly three to four times the length of the base leg 71 of a solid right-angled triangle having the angled wedge surface as its hypotenuse. Actuating the retainer forces the two longer members to press against an abutting housing wall and the three short members make essentially point contact near the center and ends of the base wall of the bar. Since the bar is very stiff, this assures more uniform application of pressure to the panel through the bar than if pressure were applied over a larger area. For a three-member retainer, a similar result is achieved by use of a large center member and small end members, the length of which may be half that specified above for the intermediate member.

Each member 32, 32' is configured with an internal longitudinal channel 50 for receiving a rod 52. The internal channel of each pressure member 32, 32' has a transverse dimension that is greater than the corresponding outside dimension of the rod so as to permit movement of the pressure members along transverse directions 41 and 42 relative to the rod (described briefly below). In contrast, channel 50 of end members 35 and intermediate members 33, 33' is not formed with as great a transverse dimension as the channels of the pressure members, since the end and intermediate members are not required to move transversely relative to the rod. Particularly, for a preferred embodiment, each intermediate member has a transverse dimension that is only slightly larger than the rod to facilitate heat conduction through the retainer. More specifically, the smaller channels in the intermediate members result in greater contact area, and thus enhanced thermal mass, at the contacting surfaces of the members.

Retainer 38 further includes a means for selectively applying a force to move slidable members 32 (or 32'), 33 (or 33') and 35 towards one another along the rod. As embodied herein, the means for selectively applying a force to the slidable members includes a head 36 formed on one end of the rod, and rod threads 37 formed on at least the opposite end of the rod (FIGS. 3–8). In a preferred embodiment, the rod threads engage the internal threads (not shown) of a nut 39. Alternatively, one end member 35 may include internal threads for mating with the rod threads, thereby eliminating the need for nut 39.

As the rod is rotated, the rod threads engage the mating threads shortening the length of the rod between the outer sides of end members 35. As a result, the wedge members are forced toward one another and pressure members 32,32' are forced to move in transverse direction 42 as pairs of inclined surfaces (54 and 56, 54 and 55) of adjacent members are caused to "ride-up" on one another (FIGS. 6–8).

Figure 7:
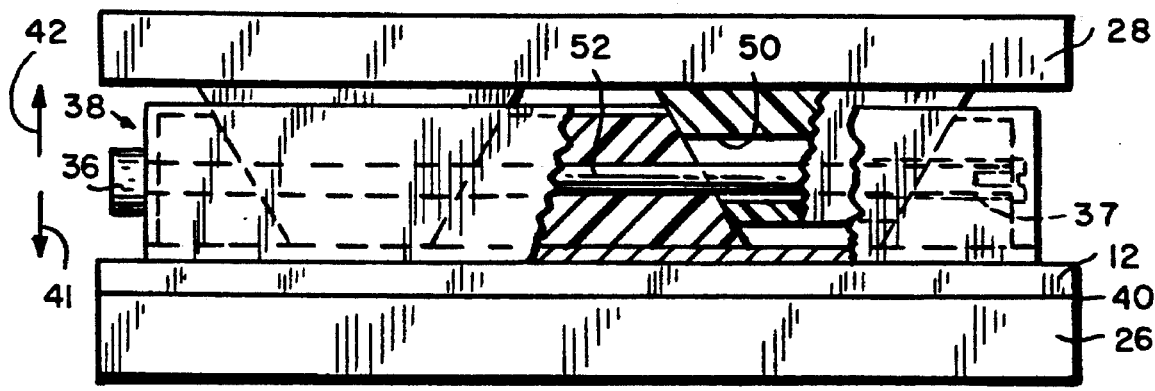
FIG. 7 is a top view of the retainer assembly of FIG. 1, shown in a locked (compressed) state and including a five-wedge retainer.
Figure 8:
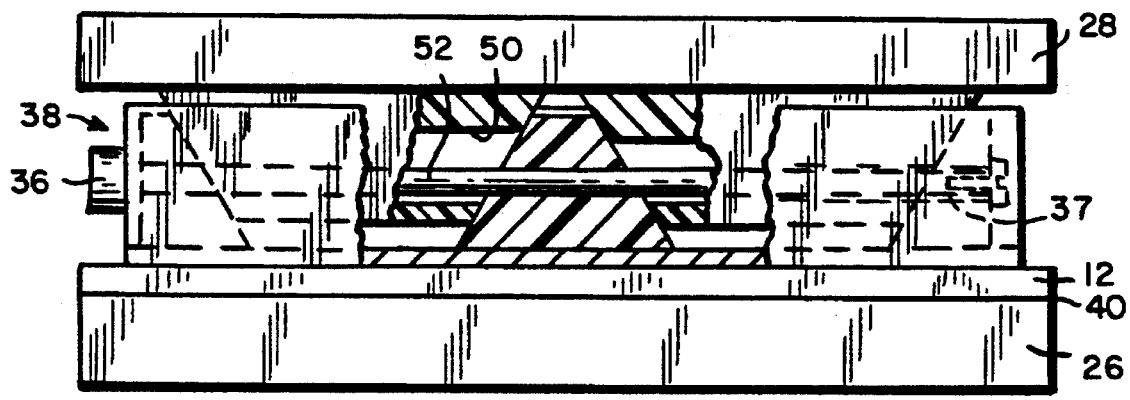
FIG. 8 is a top view of the retainer assembly of FIG. 1, shown in a locked (compressed) state and including a modified five-wedge retainer.

Comparison of FIGS. 3–5 with FIGS. 6–8, respectively, shows the movement of the members relative to one another as the assembly is moved between its unlocked (relaxed) state of FIGS. 3–5 and locked (compressed) state of FIGS. 6–8. Actuating the rod causes each pressure member 32 (or 32') to advance in transverse direction 42, forcing each clamping surface 64 to engage the housing wall 28 and forcing bar 14 to move in transverse direction 41 to press the circuit board against housing wall 26.

The multi-wedge integral circuit board retainers shown in the figures are merely illustrative of multi-wedge type circuit board retainers and are not intended to limit the scope of the instant invention. As used herein, the phrase "integral retainer" refers to a retainer which is capable of independently applying pressure to a proximal surface of the circuit board, i.e., the integral retainer and the stiff bar are distinct, independent elements of the instant invention. Accordingly, retainer 16 may be any of a variety of integral circuit board retainers presently known in the art, including retainers which hold the circuit board in position by a variety of mechanisms. Examples of such retainers include spring-loaded retainers and actuatable non-wedge retainers (see EG & G Birtcher, 4505 North Arden Drive, El Monte, Calif., 1992 Catalog, pp. 4–34). Thus, many retainers presently available or developed in future may be used in accordance with the instant invention, provided that the integral retainer can be used in combination with a bar to form an assembly for uniformly applying pressure to a circuit board portion.

The detailed structure and operation of a representative multi-wedge retainer, such as retainer 38, is disclosed in U.S. Pat. No. 4,914,552, the contents of which patent are incorporated herein by reference.

The bar 14 used herein should be a "stiff bar" having sufficient rigidity to uniformly apply pressure to an adjacent circuit board with a minimum amount of bending in the length direction of wall 44 and a minimum of twisting for this wall. This minimum bending and twisting ensures that sufficient pressure can be applied without breaking the board and that such pressure is applied uniformly enough so that void spaces between abutting surfaces of the circuit board and housing wall are eliminated or substantially reduced.

In a preferred embodiment, a bar 14 having suitable "stiffness" includes a base wall 44 and a pair of side walls 61 and 66, which together, define a recess 43 for receiving the retainer. The retainer can be held in the recess by a variety of attachment means, including bonding, mechanical means, a pair of lips 46 and 48 (FIG. 9) or a snap-in intermediate member 33' (FIGS. 10 and 11, described below) or end members 35. In a preferred embodiment, the U-shaped bar is formed of extruded aluminum with base wall 44 having a thickness of 0.225 inches and side walls 61 and 66 each having a thickness of 0.220 inches. The lengths of all walls of the bar are substantially the same for the preferred embodiment, such length varying with the size of the retainers 16 used and the size of slot 19. Bar 14 may be formed by extrusion, casting or machining processes or by folding a sheet of metal or metal alloy into the preferred configuration illustrated in the Figures. Alternatively, the bar may be formed by injection molding a thermally conductive material, which material typically is in the form of a fiber or particle. Exemplary thermally conductive materials include metal particles, e.g., aluminum or copper, ceramic particles and carbon fibers or particles. Glass fibers may be added during the injection molding process to improve the strength of the bar. In a preferred embodiment, the bar includes an anodized surface finish that is resistant to oxidation. The anodized surface finish is particularly advantageous in high humidity environments.

In a preferred embodiment, the U-shaped bar of the instant invention is used in combination with a wedge-type retainer, such as retainer 38, which retainer is held in position by a snap-in intermediate member 33'. The snap-in intermediate member permits attachment of the bar to the retainer without bonding, riveting or other more permanent attachment means. Referring to FIGS. 10 and 11, assembly 10 is assembled by inserting the snap-in intermediate member into recess 43. Alignment means 88 are provided at the top edge of bar 14 and on the top surface of the snap-in wedge to aid in assembly. The snap-in member is held in position by the combination of a lock tab 90 which may be formed by an indentation 82 in the side wall of the bar 14 or as a projection on this wall and a lock hole 86 (located on member 33'), the lock tab and hole being designed and constructed to engage one another in a snap-in fit. The engaging lock tab and hole construction described above illustrates one method for forming a snap-in fit to retain the intermediate member in the channel formed by the U-shaped bar. Other designs and constructions for retaining the intermediate member in the channel by a snap-in fit will be apparent to one of ordinary skill in the art, and are embraced within the scope of the instant invention.

Having described the invention in detail, those skilled in the art will appreciate that numerous modifications can be made therein without departing form its spirit. Therefore, it is not intended to limit the breadth of the invention to the embodiments illustrated and described. Rather, the scope of this invention is to be determined by the appended claims and their equivalents.

What is claimed:

1. An assembly adapted for mounting in a housing slot and which, when in the slot, is operable to apply pressure to a selected portion of a panel which is positioned in the housing slot between the assembly and a wall of the slot, the assembly comprising:
    a still elongated bar having a U-shaped cross-section, the bar having a base wall of selected width with side walls extending at a substantially perpendicular angle from opposite ends of the base wall, the extent of each side wall being at least a substantial fraction of the width of the base wall, the base wall and side walls defining a channel; and
    a pressure applying retainer at least a significant portion of which is mounted in said channel and oriented to apply pressure to said base wall, the assembly when mounted in the slot being oriented with said base wall facing the selected portion of the panel.

2. An assembly as claimed in claim 1, wherein said bar is formed of a thermally conductive material.

3. An assembly as claimed in claim 2, wherein said thermally conductive material is selected from the group consisting of a metal, a metal alloy, a ceramic and a carbon material.

4. An assembly as claimed in claim 3, wherein said thermally conductive material is aluminum.

5. An assembly as claimed in claim 4, wherein said aluminum bar includes an anodized finish.

6. A construction for mounting circuit boards comprising:
    a housing having a slot for each of the circuit boards, each of said slots having a base wall and a pair of opposed side walls; and
    an assembly mounted in each of said slots in which a board is to be mounted, said assembly including a stiff elongated bar having a U-shaped cross-section, the bar having a base wall of selected width with side walls extending from opposite ends of the base wall at substantially perpendicular angles, the extent of each side wall being at least a significant fraction of the width of the base wall, the base wall and side walls of said bar defining a channel, and a pressure applying retainer at least a significant portion of which is mounted in said channel and oriented to apply pressure to the base wall of the bar, an assembly, when mounted in a corresponding slot, being positioned between a circuit board mounted in the slot and a side wall of the slot and being oriented with the base wall of the bar facing the circuit board.

7. A construction as claimed in claim 6 wherein at least one of the side walls of the bar is in physical contact with a wall of the housing slot when the assembly is mounted in the slot, thereby providing an interface through which heat may be removed from the circuit board to the housing.

8. A construction as claimed in claim 7 wherein at least one of said retainer and said bar includes means for applying pressure to said at least one side wall of the bar when pressure is applied to the base wall of the bar.

9. An assembly as claimed in claim 8, wherein the housing slot includes a proximal wall and said retainer is positioned in said channel between said proximal wall and said base wall.

10. An assembly as claimed in claim 9, wherein said retainer includes a plurality of members and a means for actuating said members to apply pressure to said proximal wall and said base wall.

11. An assembly as claimed in claim 10, wherein said plurality of members are received in the channel, wherein at least one of said one members is an intermediate member, and including means for attaching said intermediate member to said bar.

12. An assembly as claimed in claim 11, wherein said intermediate member is attached to said bar by a snap-in fit.

13. An assembly as claimed in claim 12, wherein said bar includes a lock tab protruding into said channel, and said intermediate member includes a lock hole, said lock tab and lock hole interacting to engage one another to form the snap-in fit.

14. An assembly as claimed in claim 10 wherein the members contacting said bar are of minimal length.

15. An assembly as claimed in claim 11, wherein said intermediate member has a long contacting surface, a short surface opposite said long surface, and two angled surfaces interconnecting said long and short surfaces, wherein a plane extending from the short surface end of an angled side perpendicular to and extending to said long surface forms a solid right-angle triangle having as a base a portion of said long surface, and wherein the length of said long surface is approximately three to four times the length of said solid triangle base.

16. An assembly as claimed in claim 10 wherein at least one of said members is an intermediate member, wherein said means for actuating includes a rod passing through an internal channel in each member, and wherein the internal channel in said intermediate member is only large enough for said rod to pass therethrough.

17. A construction as claimed in claim 6 including means for mounting said bar to a selected portion of the circuit board.

* * * * *